(12) United States Patent
Asami

(10) Patent No.: US 6,568,105 B1
(45) Date of Patent: May 27, 2003

(54) EXTERNAL CAVITY LASER TYPE LIGHT SOURCE

(75) Inventor: Keisuke Asami, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/176,301

(22) Filed: Oct. 22, 1998

(30) Foreign Application Priority Data

Oct. 23, 1997 (JP) ............................................. 9-290987

(51) Int. Cl.[7] ................................................. H01S 3/10
(52) U.S. Cl. ............................ 37/20; 372/99; 372/102; 372/32; 372/92
(58) Field of Search ...................... 372/32, 20, 102, 372/99, 92

(56) References Cited

U.S. PATENT DOCUMENTS

| | | | | |
|---|---|---|---|---|
| 3,753,148 A | * | 8/1973 | Billman | 372/92 |
| 4,589,115 A | * | 5/1986 | Burnham et al. | 372/20 |
| 4,677,630 A | * | 6/1987 | Fujita et al. | 372/32 |
| 5,097,476 A | * | 3/1992 | Thiessen | 372/92 |
| 5,150,370 A | * | 9/1992 | Furuya et al. | 372/102 |
| 5,331,651 A | * | 7/1994 | Becker et al. | 372/32 |
| 5,333,216 A | * | 7/1994 | Sakata et al. | 385/28 |
| 5,386,426 A | * | 1/1995 | Stephens | 372/20 |
| 5,392,308 A | * | 2/1995 | Welch et al. | 372/92 |
| 5,452,312 A | * | 9/1995 | Yamamoto et al. | 372/22 |
| 5,493,575 A | * | 2/1996 | Kitamura | 372/20 |
| 5,559,816 A | | 9/1996 | Basting et al. | |
| 5,684,611 A | | 11/1997 | Rakuljic et al. | |
| 5,793,784 A | * | 8/1998 | Wagshul et al. | 372/32 |
| 6,101,211 A | * | 8/2000 | Wakabayashi et al. | 372/102 |

FOREIGN PATENT DOCUMENTS

| | | | | |
|---|---|---|---|---|
| JP | 6112-4187 A | | 6/1986 | |
| JP | 0201-6782 A | | 1/1990 | |
| JP | 402213178 A | * | 8/1990 | 372/92 |
| JP | 0327-9821 A | | 11/1991 | |
| JP | 0526-7768 A | | 10/1993 | |
| JP | 0614-0717 A | | 5/1994 | |
| JP | 0803-2161 A | | 2/1996 | |

OTHER PUBLICATIONS

Liu et al., "Novel geometry for single–mode scanning of tunable lasers," *Optic Letters* Mar. 1981, vol. 6, No. 3, p. 117.

* cited by examiner

*Primary Examiner*—Leon Scott, Jr.
(74) *Attorney, Agent, or Firm*—Finnegan, Henderson, Farabow, Garrett & Dunner LLP

(57) ABSTRACT

An external cavity laser type light source including a light emitting element, a wavelength selection element for selecting a wavelength of light emitted from the light emitting element and for returning light to the light emitting element, and an optical branch element arranged between the light emitting element and the wavelength selection element. In the external cavity laser type light source, selected light sent from the wavelength selection element is branched by the optical branch element, and one branched component is taken out as output light.

11 Claims, 2 Drawing Sheets

EXTERNAL CAVITY LASER TYPE LIGHT SOURCE

BACKGROUND OF THE INVENTION

1. Field of the Invention

The present invention relates to an external cavity laser type light source having a wavelength selection element.

2. Description of the Related Art

Referring to FIGS. 5 and 6, an external cavity type semiconductor laser light source will be described as an example of a conventional external cavity type light source. (A semiconductor laser will be referred to as LD in this specification hereinafter.)

FIG. 5 is a view showing an example of the arrangement of the conventional external cavity type LD light source. FIG. 6 is a graph showing a spectrum of output light of the external cavity type LD light source shown in FIG. 5.

In the conventional example shown in FIG. 5, reference numeral 200 designates an LD, and reference numerals 201 and 202 designate end surfaces of the LD. Usually, an antireflection coating is provided on one end surface 201 of the external cavity type LD light source so as to prevent the occurrence of Fabry-Perot resonance on both end surfaces of the LD.

After light is emitted from the end surface 201 on which the antireflection coating is provided, it is made to be parallel light by a lens 210 and then incident upon a diffraction grating 220 which is a wavelength selection element. In this connection, a band-pass filter may be used as the wavelength selection element.

After the wavelength of light is selected by the diffraction grating 220, the direction of light is changed by an angle of 180°. Then, light is condensed by the lens 210 and returned to the LD 200. In this case, an external cavity or resonator is composed of the end surface 202 of the LD 200 and the diffraction grating 220, and laser beam oscillation can be conducted by the resonator.

On the other hand, after light is emitted from the end surface 202 on which no antireflection coating is provided, it is made to be parallel light by a lens 230 and passes through an optical isolator 240. Then, light is condensed by a lens 250 and taken out from an optical fiber 260 as output light.

As shown in FIG. 6, a single wavelength selected by the diffraction grating 220 is ruling in the wavelength components of the output light. However, in addition to the single wavelength selected by the diffraction grating 220, the wavelength components of the output light contain spontaneous emission light, the wavelength band of which is wide, which is directly emitted from the LD 200 onto the lens 230.

However, the following problems may be encountered in the above external cavity type LD light source. As described above, when the above external cavity type LD light source is used, output light contains laser beam, the wavelength of which has been selected by the wavelength selection element, and spontaneous emission light which has been directly emitted from the light emitting element. Therefore, when the characteristic of an optical filter or the like is measured by combining the external cavity type LD light source with a power meter, it is impossible to conduct measurement accurately. Especially, in the case of measurement conducted on a notch type filter, the above problem becomes remarkable.

In general, a ratio of an intensity of power of the laser beam of a single wavelength to an intensity of power of spontaneous emission light of a wide wavelength band is referred to as a side mode suppression ratio, which is approximately 40 dB in the conventional example described before.

SUMMARY OF THE INVENTION

An object of the present invention is to provide an external cavity laser type light source, the wavelength purity of output light of which is very high, wherein an unnecessary spontaneous emission light component except for a selected wavelength component is cut off from the output light.

To achieve the above object, the invention provides an external cavity laser type light source comprising: a light emitting element; a wavelength selection element for selecting a wavelength of light emitted from the light emitting element and for returning light to the light emitting element; and an optical branch element arranged between the light emitting element and the wavelength selection element, wherein selected light sent from the wavelength selection element is branched by the optical branch element, and one branched component is taken out as output light.

According to the invention, the optical branch element is arranged between the light emitting element and the wavelength selection element, and light selected by the wavelength selection element is branched into two beams of light by the optical branch element. Then, one of the branched beams of light is taken out as output light. Due to the foregoing, an unnecessary spontaneous emission light component, the wavelength of which is different from the selected wavelength, can be cut off from the output light, so that the output light of highly pure wavelength can be obtained.

Here, examples of the light emitting element are a semiconductor laser element, a solid state laser element, a liquid laser element and a gas laser element. An example of the optical branch element is an unpolarized light beam splitter. Examples of the wavelength selection element are a filter type wavelength selection element and a diffraction grating type wavelength selection element.

Further, the invention provides an external cavity laser type light source comprising: a light emitting element; a diffraction grating for selecting a wavelength of light emitted from the light emitting element and for returning light to the light emitting element; and a mirror for reflecting light, wavelength of which has been selected by the diffraction grating, so that a direction of light is changed by an angle of 180° and light is made to be incident upon the diffraction grating again, the mirror being a multiple-surface reflecting mirror having at least two reflecting surfaces, angles of which are different from each other.

According to the invention, there is provided the mirror for reflecting light, the wavelength of which has been selected by the diffraction grating, so that the direction of light can be changed by an angle of 180° and the light can be made to be incident upon the diffraction grating again. Therefore, a portion of light, the wavelength of which has been selected in the diffraction grating, is returned to the light emitting element. Since the mirror is a multiple-surface reflecting mirror having at least two reflecting surfaces, the angles of which are different from each other, a portion of light, the wavelength of which has been selected in the diffraction grating, proceeds in a direction different from that of the optical axis of the light emitting element.

Since light, the wavelength of which has been selected in the diffraction grating, is branched into two beams of light by the mirror, one of the beams of light can be taken out as output light. That is, output light, the wavelength purity of which is very high, from which an unnecessary spontaneous emission light component except for the selected wavelength component is removed, can be obtained.

DETAILED DESCRIPTION OF THE PREFERRED EMBODIMENTS

Referring to FIGS. 1 to 4(c), embodiments of the external cavity laser type light source of the present invention will be described below.

[First Embodiment]

Figure 1:
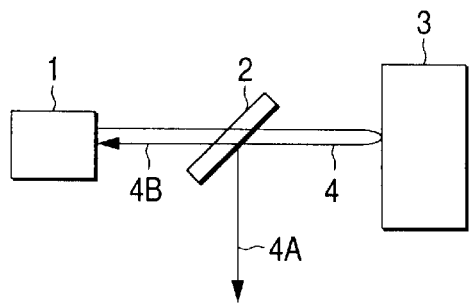
FIG. 1 is an arrangement view showing a first embodiment of the external cavity laser type light source to which the present invention is applied.

FIG. 1 is an arrangement view showing a first embodiment of the external cavity laser type light source to which the present invention is applied.

As shown in FIG. 1, the external cavity laser type light source of this embodiment includes: a light emitting element 1; a wavelength selection element 3 for selecting a wavelength of light emitted from the light emitting element 1; and an optical branch element 2 for branching selected light 4, which has been sent from the wavelength selection element 3, into output light 4A and return light 4B.

In the external cavity laser type light source arranged as described above, light emitted from one end surface 1a of the light emitting element 1 is incident upon the wavelength selection element 3 via the optical branch element 2. Light incident upon the wavelength selection element 3 is subjected to wavelength selection. After that, the direction of light is changed by an angle of 180° and proceeds. Then, light is incident upon the optical branch element 2.

A portion of the selected light 4 incident upon the optical branch element 2 is transmitted through the optical branch element 2 and returned to the light emitting element 4 as the return light 4B. Here, an external cavity or resonator is composed of the wavelength selection element 3 and the end surface 1b of the light emitting element 2, and laser oscillation is conducted by this external resonator.

The other portion of light, which has not been transmitted through the optical branch element 2, is reflected on the optical branch element 2, so that the direction of light is changed by an angle of 90°. This light is outputted outside as the output light 4A.

Angle adjustment and cavity length adjustment of the wavelength selection element 3 are conducted by a rotating mechanism and a slide stage not shown in the drawings. Thus, the wavelength can be varied.

Next, referring to FIG. 2, description will be given of this external cavity laser type light source in the case where the light emitting element 1 is an LD, the optical branch element 2 is an unpolarized light beam splitter, and the wavelength selection element 3 is a diffraction grating.

Figure 2:
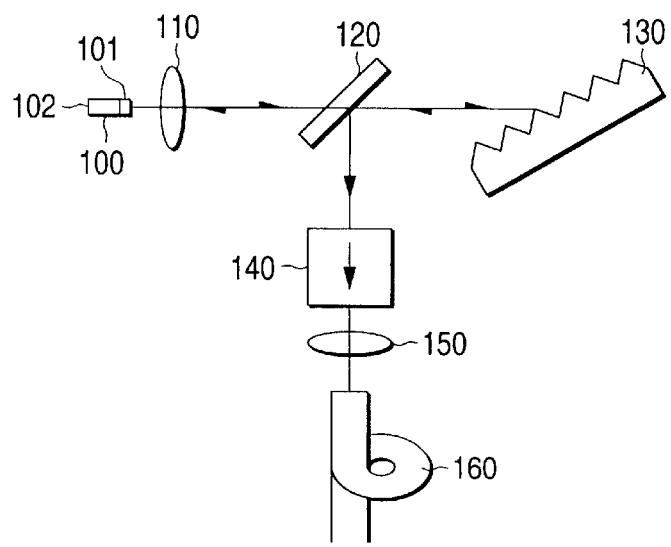
FIG. 2 is an arrangement view showing an external cavity type LD light source which is an example of the external cavity type light source.
Figure 3:
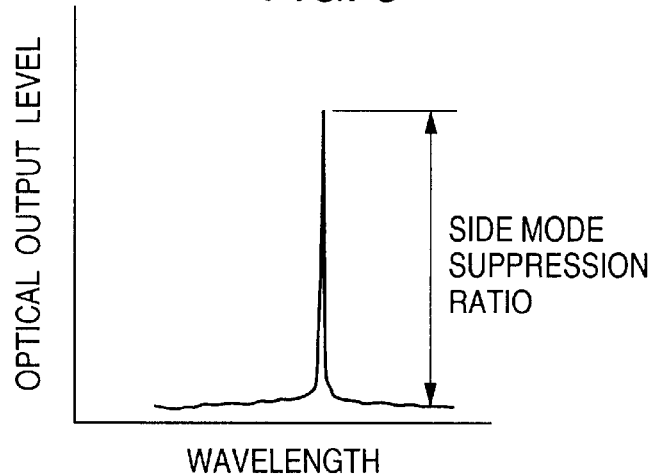
FIG. 3 is a graph showing a spectrum of output light which is outputted from the external cavity type LD light source shown in FIG. 2.
Figure 4:
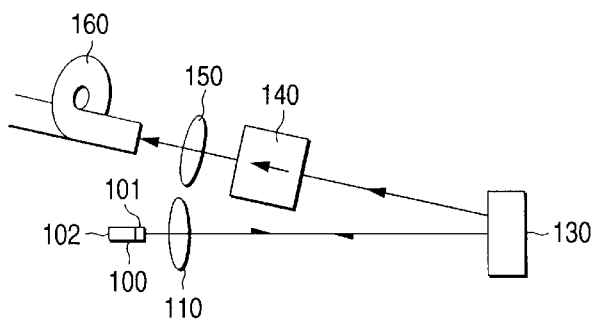
FIG. 4(a) is a plan view showing a second embodiment of the external cavity type LD light source to which the present invention is applied.
FIG. 4(b) is a side view showing the same.
FIG. 4(c) is a side view showing a mirror in the second embodiment.
Figure 4:
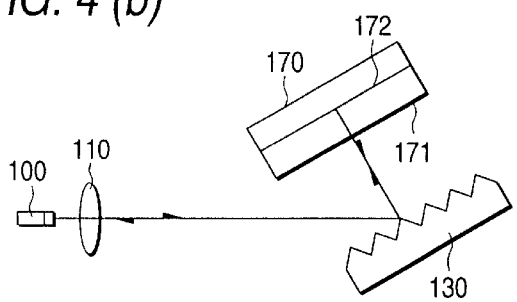
Figure 4:
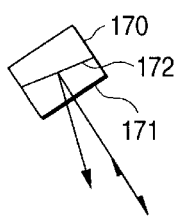
Figure 5:
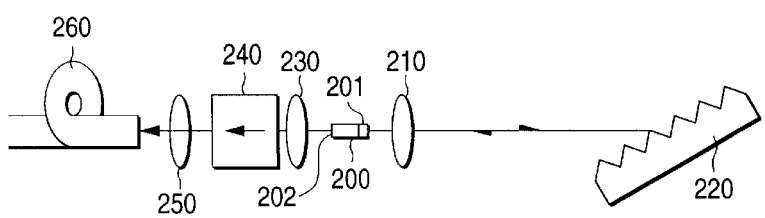
FIG. 5 is a view showing an example of the arrangement of a conventional external cavity type LD light source.
Figure 6:
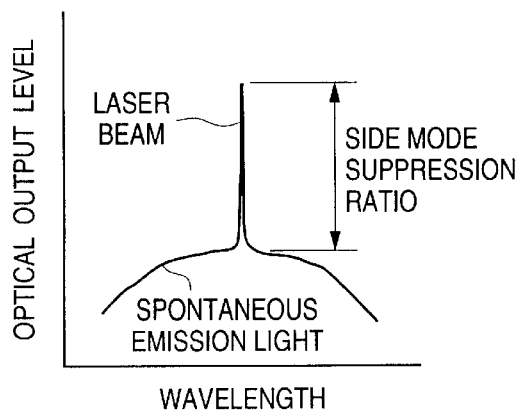
FIG. 6 is a graph showing a spectrum of output light of the external cavity type LD light source shown in FIG. 5.

FIG. 2 is an arrangement view showing an external cavity type LD light source which is an example of the external cavity type light source. FIG. 3 is a graph showing a spectrum of output light which is outputted from the external cavity type LD light source shown in FIG. 2.

As shown in FIG. 2, this external cavity type LD light source includes: an LD 100 which is used as a light emitting element, a lens 110, an unpolarized light beam splitter 120 which is used as an optical branch element, a diffraction grating 130 which is used as a wavelength selection element, an optical isolator 140, a lens 150, and an optical fiber 160. On an end surface 101 of the LD 100, there is provided an antireflection coating in the same manner as that of the conventional case.

In the external cavity type LD light source arranged as described above, light emitted from the end surface 101 is made to be parallel light by the lens 110. Then, the light passes through the unpolarized light beam splitter 120 and is incident upon the diffraction grating 130.

Here, the transmittance of the unpolarized light beam splitter 120 is 80% (the reflectance is 20%). Therefore, 80% of a quantity of light incident upon the unpolarized light beam splitter 120 is incident upon the diffraction grating 130.

Light incident upon the diffraction grating 130 is subjected to wavelength selection. After that, the direction of light is changed by an angle of 180°. Then, light is incident again upon the unpolarized light beam splitter 120. Then, 80% of a quantity of light incident upon the unpolarized light beam splitter 120 is transmitted through the unpolarized light beam splitter 120, and 20% thereof is reflected on the unpolarized light beam splitter 120 and proceeds.

After light is transmitted through the unpolarized light beam splitter 120, it proceeds straight as it is. Then, light is condensed by the lens 110 and returned to the LD 100. Here, an external cavity or resonator is composed of the diffraction grating 120 and the end surface 102 of the LD 100, and laser oscillation is conducted by this external resonator.

On the other hand, when light is reflected on the unpolarized light beam splitter 120, it changes the direction by an angle of 90°. Then, light passes through the optical isolator 140 and is condensed by the lens 150. The thus condensed light is taken outside as output light by the optical fiber 160.

Concerning output light which has been taken outside in this way, the spontaneous emission light component generated in the LD 100 is subjected to wavelength selection in the diffraction grating 130. Therefore, as shown in FIG. 3, a component of the wavelength except for the selected wavelength is very small, and its side mode suppression ratio exceeds 60 dB.

For example, after light is subjected to wavelength selection by the diffraction grating 130, it may be once sent to the transverse direction and then totally reflected on a mirror so that the thus reflected light is incident upon the diffraction grating 130 again. In this case, light is twice subjected to wavelength selection by the diffraction grating 130. Due to tis, the wavelength selectivity can be further enhanced.

The wavelength selection element 3 is not limited to the above diffraction grating 130. For example, it is possible to use a band-pass filter as the wavelength selection element 3.

In this case, light emitted from the end surface 101 of the LD 100 passes through the unpolarized light beam splitter 120 and is incident upon the band-pass filter. When light is incident upon the band-pass filter, it is subjected to wavelength selection in the process of passing through the band-pass filter, so that only light of a specific wavelength can be transmitted through the band-pass filter. Light which has been transmitted through the band-pass filter is reflected on the mirror, so that the direction of light is changed by an angle of 180°. Then light is transmitted again through the band-pass filter and incident upon the unpolarized light beam splitter 120.

Light incident upon the unpolarized beam splitter 120 is branched into two beams of light in the same manner as that described before. One of the beams is taken outside as output light by the optical fiber 160, and the other beam is returned to the LD 100.

As described above, according to the external cavity laser type light source of the first embodiment, the optical branch element 2 is arranged between the light emitting element 1 and the wavelength selection element 3, and selected light sent from the wavelength selection element 3 is branched by the optical branch element 2, and one branched component is taken out as output light. Therefore, an unnecessary spontaneous emission light component, the wavelength of which is different from the selected wavelength, can be cut off from the output light, so that the output light of highly pure wavelength can be obtained.

Further, if the wavelength selection element 3 is rotated by an arbitrary angle with a rotating mechanism or the like, it is possible to select an arbitrary wavelength in accordance with the rotation angle.

Furthermore, if the wavelength selection element 3 is moved with a slide stage or the like by a predetermined distance in the direction of the optical axis of the light emitting element 1, it is possible to select an arbitrary wavelength in accordance with the distance of movement.

[Second Embodiment]

FIG. 4(a) is a plan view showing a second embodiment of the external cavity type LD light source to which the present invention is applied, FIG. 4(b) is a side view showing the same, and FIG. 4(c) is a side view of a mirror in the second embodiment.

As shown in FIGS. 4(a) to 4(c), the external cavity type LD light source of this embodiment includes: an LD 100, a lens 110, a diffraction grating 130, an optical isolator 140, a lens 150, an optical fiber 160, and a mirror 170. In this embodiment, like reference characters are used to designate like parts in the first embodiment, and the description thereof is omitted here.

The mirror 170 is a multiple-surface reflecting mirror having a plurality of reflecting surfaces, the angles of which are different from each other, that is, the reflecting mirror 170 is provided with a first reflecting surface 171 and a second reflecting surface 172.

On the first reflecting surface 171, selected light sent from the diffraction grating 130 is reflected and the direction of light is changed by an angle of 180°. The thus reflected light is incident upon the diffraction grating 130 again and returned to the LD 100 as returning light.

On the other hand, the second reflecting surface 172 reflects light sent from the diffraction grating 130 in such a manner that the angle is shifted in the direction of the grooves of the diffraction grating 130. Light incident again upon the diffraction grating 130 is reflected, so that it proceeds in a direction different from that of the optical axis of the LD 100. Then, light passes through the optical isolator 140 and is condensed by the lens 150. Then, light is taken outside as output light by the optical fiber 160.

In this embodiment, the mirror 170 is provided with a plurality of reflecting angles, and light returning from the diffraction grating 130 is separated. Therefore, it is unnecessary to provide an optical branch element between the LD 100 and the diffraction grating 130.

For example, the mirror 170 may be composed of a single reflecting surface of a partial reflecting film, and light which has been transmitted through the mirror 170 may be used as output light. However, the beam profile becomes elliptical in this case. Therefore, it is difficult to effectively combine the transmitted light with the optical fiber.

As described above, according to the external cavity type LD light source of the second embodiment, there is provided the mirror 170 for reflecting light, the wavelength of which has been selected by the diffraction grating 130, so that the direction of light can be changed by an angle of 180° and light can be made to be incident upon the diffraction grating 130 again. Therefore, a portion of light, the wavelength of which has been selected in the diffraction grating 130, is returned to the LD 100. Further, since the mirror 170 is a multiple-surface reflecting mirror having at least two reflecting surfaces, the angles of which are different from each other, a portion of light, the wavelength of which has been selected in the diffraction grating 130, proceeds in a direction different from that of the optical axis of the LD 100.

Since light, the wavelength of which has been selected in the diffraction grating 130, is branched into two beams of light by the mirror 170, one of the beams of light can be taken out as output light. That is, output light, the wavelength purity of which is very high, from which an unnecessary spontaneous emission light component except for the selected wavelength is cut off, can be obtained.

Incidentally, the present invention is not limited to the external cavity type LD light source of this embodiment. For example, the light emitting element is not limited to a semiconductor laser element, but it is possible to use a solid state laser element, a liquid laser element and a gas laser element.

Of course, modifications may be appropriately made also in the details of the specific structure.

According to the first embodiment of the invention, the optical branch element is arranged between the light emitting element and the wavelength selection element, and selected light sent from the wavelength selection element is branched by the optical branch element, and one branched component is taken out as output light. Thus, an unnecessary spontaneous emission light component, the wavelength of which is different from the selected wavelength, can be removed from the output light, so that the output light of highly pure wavelength can be obtained.

According to the second embodiment of the invention, there is provided the mirror for reflecting light, the wavelength of which has been selected by the diffraction grating, so that the direction of light can be changed by an angle of 180° and light can be made to be incident upon the diffraction grating again. Therefore, a portion of light, the wavelength of which has been selected in the diffraction grating, is returned to the light emitting element. Since the mirror is a multiple-surface reflecting mirror having at least two reflecting surfaces, the angles of which are different from each other, a portion of light, the wavelength of which has been selected in the diffraction grating, proceeds in a direction different from that of the optical axis of the light emitting element.

Since light, the wavelength of which has been selected in the diffraction grating, is branched into two beams of light by the mirror, one of the beams of light can be taken out as output light. That is, the output light, the wavelength purity of which is very high, from which an unnecessary spontaneous emission light component except for the selected wavelength is cut off, can be obtained.

What is claimed is:

1. An external cavity laser light source comprising:
   a light emitting element for emitting a first light beam having a first wavelength distribution;
   a wavelength selection element for selecting a wavelength of the first light beam and for returning a second light beam having a second wavelength distribution different from the first wavelength distribution to said light emitting element, said wavelength selection element including a band-pass filter and a mirror, in which the first light beam is introduced into the band-pass filter, output to the mirror, reflected by the mirror, again introduced into the band-pass filter, and outputted as the second light beam;
   an optical branch element arranged between said light emitting element and said wavelength selection element,
   wherein the optical branch element branches the second light beam in a direction to be taken out as an output light beam; and
   the output light beam contains no component of the first light beam directly emitted from the light emitting element.

2. The external cavity laser light source according to claim 1, wherein said light emitting element includes a semiconductor laser element.

3. The external cavity laser light source according to claim 1, wherein said wavelength selection element includes a diffraction grating.

4. The external cavity laser light source according to claim 1, further comprising a rotating mechanism for rotating said wavelength selection element by a predetermined angle.

5. The external cavity-laser light source according to claim 1, further comprising a slide stage for moving said wavelength selection element by a predetermined distance in a direction perpendicular to an optical axis of said light emitting element.

6. The external cavity laser light source according to claim 1, wherein said optical branch element includes an unporalized light beam splitter.

7. The external cavity laser light source as claimed in claim 1, wherein the optical branch element has a reflection surface facing between the wavelength selection element and the output direction, the reflection surface to reflect the selected light sent directly from the wavelength selection element to be output as the output light beam.

8. An external cavity laser light source comprising:
   a light emitting element for emitting a first light beam having a first wavelength distribution;
   a diffraction grating for selecting a wavelength of the first light beam and for returning a second light beam having a second wavelength distribution different from the first wavelength distribution to said light emitting element; and
   a multiple-surface reflecting mirror having a first reflecting surface for reflecting the first light beam wavelength selected by the diffraction grating and again introducing the first light beam onto the diffraction grating, and a second reflecting surface different in surface angle from the first reflecting surface, the second reflecting surface for reflecting the first light beam to be taken out as an output light beam.

9. The external cavity laser light source according to claim 8, wherein said light emitting element includes a semiconductor laser element.

10. An external cavity laser light source comprising:
    a light emitting element for emitting a first light beam having a first wavelength distribution;
    a wavelength selection element for selecting a wavelength of the first light beam and for returning a second light beam having a second wavelength distribution different from the first wavelength distribution to said light emitting element, the wavelength selection element including a diffraction grating for diffracting the first light beam for selection of a wavelength thereof and a mirror for reflecting the first light beam diffracted by said diffraction grating to resend the first light beam to said diffraction grating, whereby the first light beam is diffracted by the diffraction grating twice and outputted as the second light beam; and
    an optical branch element arranged between said light emitting element and said wavelength selection element,
    wherein the optical branch element branches the second light beam in an output direction to be taken out as an output light beam, and
    the output light beam contains no component of the first light beam directly emitted from the light emitting element.

11. The external cavity laser light source as claimed in claim 10, wherein the optical branch element has a reflection surface facing between the wavelength selection element and the output direction, the reflection surface to reflect the selected light sent directly from the wavelength selection element to be output as the output light beam.

* * * * *